United States Patent
Wagner et al.

(10) Patent No.: US 10,492,347 B2
(45) Date of Patent: Nov. 26, 2019

(54) METHOD FOR PRODUCING A HOUSING HAVING SHIELDING AGAINST ELECTRIC AND/OR MAGNETIC RADIATION, AND HOUSING HAVING THE SHIELDING

(71) Applicant: Bayerische Motoren Werke Aktiengesellschaft, Munich (DE)

(72) Inventors: Matthias Wagner, Munich (DE); Harald Mineif, Munich (DE); Philip Raettich, Munich (DE); Semi Ben Salah, Finsing (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 0 days.

(21) Appl. No.: 14/918,970

(22) Filed: Oct. 21, 2015

(65) Prior Publication Data

US 2016/0044840 A1   Feb. 11, 2016

Related U.S. Application Data

(63) Continuation of application No. PCT/EP2014/063276, filed on Jun. 24, 2014.

(30) Foreign Application Priority Data

Jul. 5, 2013 (DE) .................. 10 2013 213 233

(51) Int. Cl.
*H05K 9/00* (2006.01)
*B60L 50/64* (2019.01)
(Continued)

(52) U.S. Cl.
CPC .......... *H05K 9/0084* (2013.01); *B29C 43/18* (2013.01); *B29C 43/184* (2013.01); *B29C 45/14* (2013.01);
(Continued)

(58) Field of Classification Search
CPC . H01M 2/1094; H05K 9/0007; H05K 9/0045; H05K 9/0084; H05K 9/0073;
(Continued)

(56) References Cited

U.S. PATENT DOCUMENTS 4,331,285 A * 5/1982 Gottwals .............. H05K 9/0007
                                                  174/380
5,008,487 A * 4/1991 Shimmyo ............ H05K 9/0073
                                                  174/353
(Continued)

FOREIGN PATENT DOCUMENTS

CN       1284256 A       2/2001
CN       1316089 A      10/2001
(Continued)

OTHER PUBLICATIONS

Chinese Office Action issued in counterpart Chinese Application No. 201480034231.2 dated Oct. 28, 2016 with English translation (20 pages).
(Continued)

*Primary Examiner* — A. Dexter Tugbang
(74) *Attorney, Agent, or Firm* — Crowell & Moring LLP

(57) ABSTRACT

A method for producing a housing having shielding against electric and/or magnetic radiation is provided, in which an electrically and/or magnetically conductive foil is formed into a shape corresponding to and inner or an outer wall of a housing made of an electrically and/or magnetically non-conductive material, and the foil is arranged on the inner or outer wall of the housing. The foil shape may be formed separate from the foils application to the inner or outer wall of the housing, or may be shaped in conjunction with the forming of the non-conductive housing.

10 Claims, 4 Drawing Sheets

(51) Int. Cl.
*H01M 2/10* (2006.01)
*B29C 43/18* (2006.01)
*B29C 45/14* (2006.01)

(52) U.S. Cl.
CPC .... *B29C 45/1418* (2013.01); *B29C 45/14221* (2013.01); *B60L 50/64* (2019.02); *H01M 2/1094* (2013.01); *H05K 9/0007* (2013.01); *H05K 9/0045* (2013.01); *H05K 9/0073* (2013.01); *B60L 2270/147* (2013.01); *Y02T 10/7005* (2013.01); *Y02T 10/705* (2013.01); *Y10T 29/49146* (2015.01); *Y10T 29/49158* (2015.01); *Y10T 29/49172* (2015.01)

(58) Field of Classification Search
CPC ............ B60L 11/1879; B60L 2270/147; B60L 50/64; B29C 43/18; B29C 43/184; B29C 45/14; B29C 45/1418; B29C 45/14221; Y02T 10/705; Y02T 10/7055; Y10T 29/49146; Y10T 29/49158; Y10T 29/49172
See application file for complete search history.

(56) References Cited

U.S. PATENT DOCUMENTS

| | | | |
|---|---|---|---|
| 5,473,111 A * | 12/1995 | Hattori | H05K 9/0045 174/363 |
| 5,593,631 A * | 1/1997 | Hara | B29C 43/184 264/257 |
| 6,001,282 A | 12/1999 | Kanase | |
| 6,312,550 B1 * | 11/2001 | Tiburtius | H05K 9/0015 |
| 6,392,900 B1 | 5/2002 | Petty et al. | |
| 6,547,252 B1 | 4/2003 | Kahl et al. | |
| 6,593,524 B1 * | 7/2003 | Toedtman | H05K 9/0045 |
| 2004/0120131 A1 * | 6/2004 | Arnold | H05K 9/0084 361/818 |
| 2009/0091907 A1 * | 4/2009 | Huang | H05K 9/0084 361/818 |
| 2010/0172116 A1 * | 7/2010 | Yorita | H05K 9/0084 361/816 |
| 2011/0234096 A1 | 9/2011 | Asmussen et al. | |

FOREIGN PATENT DOCUMENTS

| | | | |
|---|---|---|---|
| CN | 1345528 A | | 4/2002 |
| DE | 24 15 643 A1 | | 10/1975 |
| DE | 101 09 361 A1 | | 9/2002 |
| DE | 10 2011 077 187 A1 | | 12/2012 |
| EP | 1 933 609 A1 | | 6/2008 |
| FI | 940803 A | | 8/1995 |
| JP | 61063445 A | * | 4/1986 |
| JP | 07007284 A | * | 1/1995 |
| JP | 8-31969 A | | 2/1996 |
| JP | 2000-101277 A | | 4/2000 |

OTHER PUBLICATIONS

International Search Report (PCT/ISA/210) issued in PCT Application No. PCT/EP2014/063276 dated Sep. 29, 2014 with English translation (five pages).
German Search Report issued in counterpart German Application No. 10 2013 213 233.6 dated Jan. 29, 2014 with partial English translation (10 pages).
Chinese Office Action issued in counterpart Chinese Application No. 201480034231.2 dated Jun. 26, 2017 with English translation (21 pages).
German-language Office Action issued in counterpart European Application No. 14 732 557.5 dated May 17, 2019 (four (4) pages).

* cited by examiner

METHOD FOR PRODUCING A HOUSING HAVING SHIELDING AGAINST ELECTRIC AND/OR MAGNETIC RADIATION, AND HOUSING HAVING THE SHIELDING

CROSS REFERENCE TO RELATED APPLICATIONS

This application is a continuation of PCT International Application No. PCT/EP2014/063276, filed Jun. 24, 2014, which claims priority under 35 U.S.C. § 119 from German Patent Application No. 10 2013 213 233.6, filed Jul. 5, 2013, the entire disclosures of which are herein expressly incorporated by reference.

BACKGROUND AND SUMMARY OF THE INVENTION

The present invention relates to a method for producing a housing having shielding from electric and/or magnetic radiation. In addition, the invention relates to a housing having such shielding from electric and/or magnetic radiation, as well as a high-voltage storage device having shielding from electric and/or magnetic radiation.

An electric apparatus may have an electric device and a housing that protectively encloses the electric device. To ensure satisfactory operation of the electric device, it is necessary with numerous electric apparatuses for the housing to shield the electric device from electromagnetic radiation. Such electric apparatuses include, for example, high-voltage storage devices, which are provided for supplying the electric power in motor vehicles having an electric drive.

For EMC shielding of an electric apparatus, for example, a high-voltage storage device, the apparatus may have a metallic housing, which is therefore electrically conductive. If an electric device is enclosed by an electrically nonconductive housing, for example, a plastic housing, additional measures must then be provided on the housing, so that the housing will be electrically conductive, despite its electrically nonconductive base material.

For example, conductive EMC paints may be applied to the surface of an electrically nonconductive housing. In addition, EMC cloth or conductive nonwovens may be inserted into the nonconductive base material of the housing. In addition, there is the possibility of adding fillers that are electrically conductive to the electrically nonconductive base material, for example, a plastic material, of a housing.

However, such a shielding can be damaged easily. In addition, the measures mentioned above often result in only poor shielding properties. It is often impossible to ensure a homogeneous conductivity of the housing. In addition, this has a negative influence on the required mechanical properties of the housing. Cloth, nonwovens or EMC paints usually require manual application, so they are not suitable for mass production. These methods are very complex on the whole and are associated with high costs.

It is therefore desirable to provide a method for producing a housing having shielding from electric and/or magnetic radiation, by which shielding of an electric device from electric and/or magnetic radiation is ensured in a simple and reliable manner. Furthermore, a method for production of a high-voltage storage device having shielding from electric and/or magnetic radiation is to be provided, by which shielding of the high-voltage storage device from electric and/or magnetic radiation is ensured in a simple and reliable manner. In addition, there is a need for providing a housing with shielding from electric and/or magnetic radiation, by which an electric device can be shielded from electric and/or magnetic radiation in a simple and reliable manner. Furthermore, a high-voltage storage device having shielding from electric and/or magnetic radiation is to be provided, which can be protected reliably and easily from electric and/or magnetic radiation.

One method for production of a housing having shielding from electric and/or magnetic radiation according to the invention provides for making available an electrically and/or magnetically conductive foil, as well as making available a housing made of an electrically and/or magnetically nonconductive material. The housing has an outer wall and an inner wall. The foil is shaped in such a way that the shape of the foil corresponds to the shape of the outer or inner wall of the housing. The foil is arranged on the outer or inner wall of the housing.

The foil can be reshaped from its original shape by use of a molding tool, for example, by pressing the foil against a wall of the molding tool after inserting it into the molding tool. The wall of the molding tool is the inverse of that of the housing made of the electrically and/or magnetically nonconductive material to which the foil is attached. By way of another molding tool, which again has the inverse shape from the molding tool, the foil is pressed against the wall of the molding tool and thereby shaped so that it is designed to be suitable for covering the housing and/or for lining the interior of the housing after being pressed against the wall of the molding tool.

While the foil is being pressed against the wall of the molding tool, the foil can be fed into the molding tool from its side edges. The folds that develop when the foil is pressed against the wall of the molding tool can be pressed into the required geometry during the reshaping operation. After reshaping the foil, the reshaped foil can be applied to the electrically and/or magnetically nonconductive housing. For example, the foil can be applied to the outer or inner wall of the housing by hot sealing, adhesive bonding or by screw connection.

According to another embodiment of the method, the foil in its original form can be placed in the molding tool and pressed against the wall of the molding tool, so that the wall of the molding tool is lined with the foil. Next, the foil can be back-injected with the electrically nonconductive material extruded onto it. According to one possible embodiment, the electrically and/or magnetically nonconductive material of the housing can be applied to a surface of the additional molding tool, which has an inverse shape from that of the molding tool, whose wall is lined with the foil. A plastic mass can be applied to the surface of the additional molding tool in the case of a housing made of plastic, for example. The electrically nonconductive material is pressed against the foil in contact with the wall of the molding tool. In this way, the foil and the electrically nonconductive material of the housing can be connected directly to one another.

One embodiment of the method for production of a high-voltage storage device having shielding from electric and/or magnetic radiation according to the invention provides for production of a housing having shielding from electric and/or magnetic radiation. According to this method, an additional housing of an electrically and/or magnetically conductive material is provided, a charge storage device of the high-voltage storage device being enclosed by the additional housing. The housing having the shielding from electric and/or magnetic radiation is arranged as the high-voltage storage device cover on the additional housing. The charge storage device of the high-voltage storage device is thus easily and reliably protected from electric and magnetic radiation.

According to one embodiment of a housing having shielding from electric and/or magnetic radiation, the housing includes an electrically and/or magnetically conductive foil. The housing is made of electrically and/or magnetically nonconductive material and has an outer and inner wall. The foil is designed so that the shape of the foil corresponds to the shape of the outer or inner wall of the housing. The foil is arranged on the outer or inner wall of the housing. The housing having shielding from electric and/or magnetic radiation and, in particular, the foil of the housing are produced according to one of the embodiments of the method described above.

According to one embodiment of a high-voltage storage device having shielding from electric and/or magnetic radiation, the high-voltage storage device includes one housing plus an additional housing made of an electrically and/or magnetically conductive material. In addition, the high-voltage storage device has a charge storage device, which is arranged in the additional housing.

The housing is arranged on the additional housing in such a way that the charge storage device is covered by the housing. The charge storage device of the high-voltage storage device is shielded from electric and/or magnetic radiation due to the encapsulation of the charge storage device by the housing having the electrically and/or magnetically conductive foil and the additional housing made of the electrically and/or magnetically conductive material.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
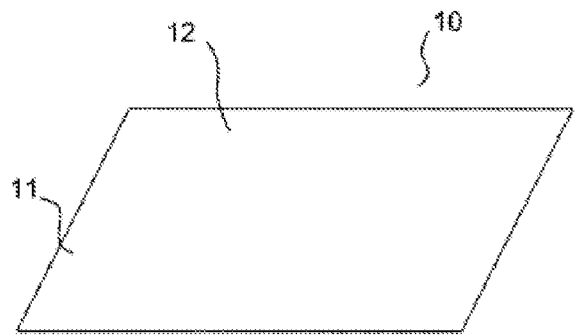
FIG. 1 is a schematic diagram of an embodiment of a foil made of an electrically and/or magnetically conductive material for reshaping.

FIG. 1 shows an embodiment of a foil 10 made of an electrically and/or magnetically conductive material. The foil may be formed from aluminum, for example, as an electrically conductive material. The material may also be embodied as a steel sheet foil, for example. In this embodiment, the foil has both electrically and magnetically conductive properties. The foil may be provided as a flat layer of sheeting material. On at least one side, the foil may have an adhesive coating 11 or a plastic coating 12, for example, a coating of PP (polypropylene).

Figure 2:
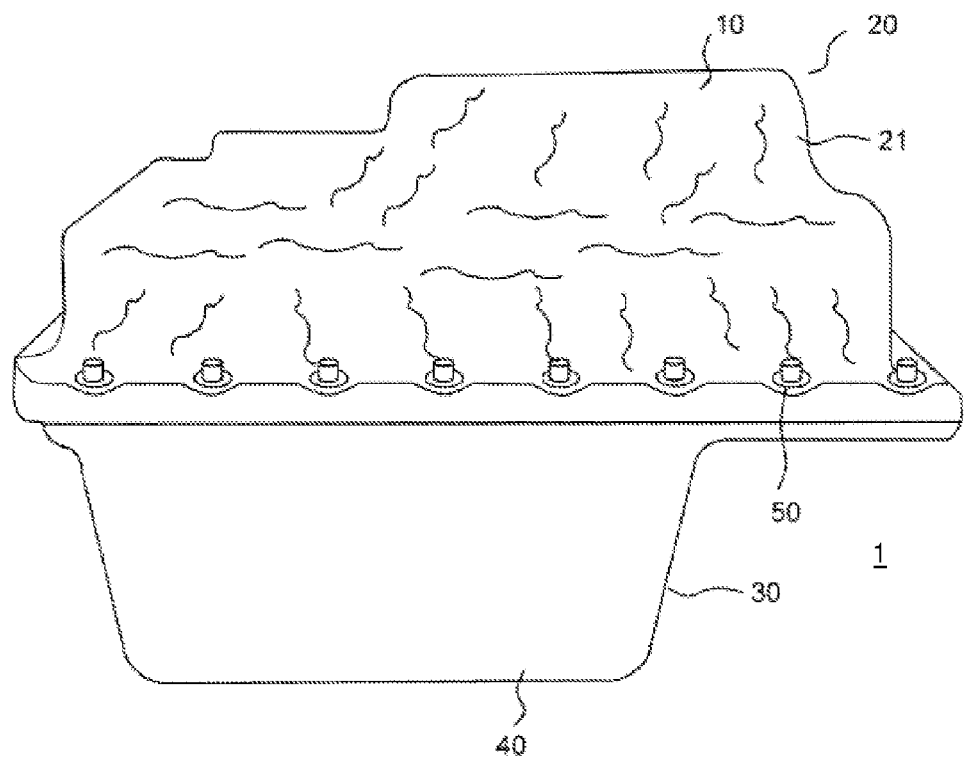
FIG. 2 is a perspective view of one embodiment of an electric apparatus having shielding from electric and/or magnetic radiation.
Figure 3:
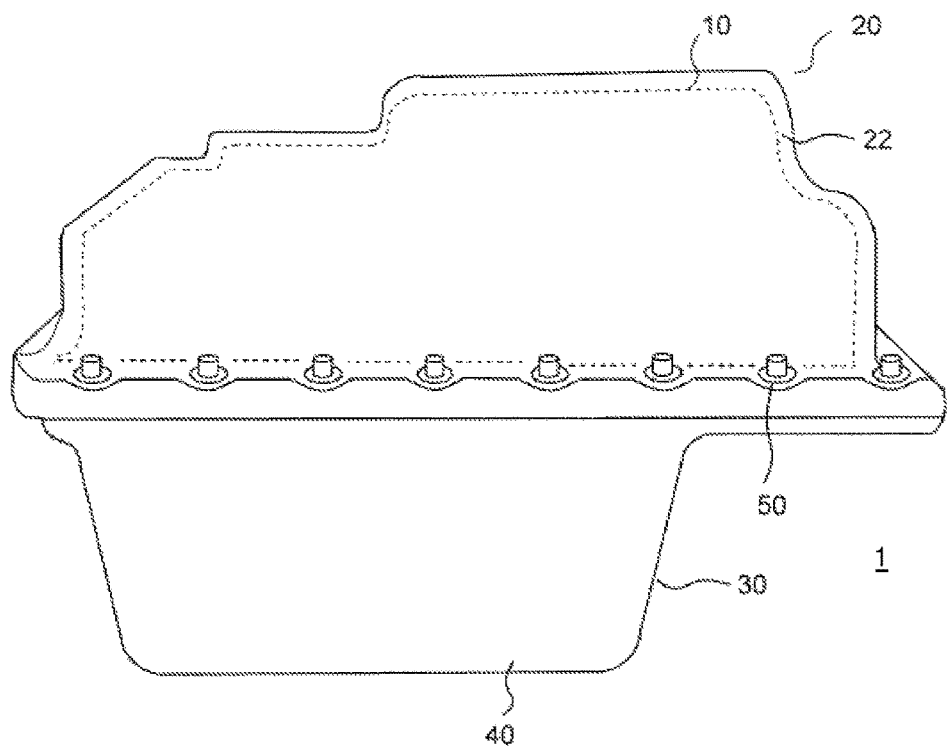
FIG. 3 is a perspective view of an additional embodiment of an electric apparatus having electric shielding from electric and/or magnetic radiation.

FIGS. 2 and 3 show various embodiments of an electric apparatus 1 having shielding from electric and/or magnetic radiation. The electric apparatus 1 may be designed as a high-voltage storage device, for example. The electric apparatus has an electrically and/or magnetically conductive foil 10, a housing 20 composed of an electrically and/or magnetically non-conductive material, a housing 30 made of an electrically and/or magnetically conductive material as well as at least one electric device 40. If the electric apparatus 1 is designed as a high-voltage storage device, then the electric device may be a charge storage device, for example.

The at least one electric device 40 is arranged in the housing 30. The at least one electric device 40 is already partially protected from electric and/or magnetic radiation by the housing 30 because of the electrically and/or magnetic conductive material properties of the housing 30. The housing 30 protects the at least one electric device 40 from electric and/or magnetic radiation, at least on the bottom side and partially from the side.

To also protect the at least one electric device 40 from electric and/or magnetic radiation on the top side, the foil 10 made of the electrically and/or magnetically conductive material is arranged on the housing 20. The housing 20 may contain, for example, a material made of plastic, and the foil 10 may be embodied as an aluminum or steel sheet foil, as already explained in conjunction with FIG. 1.

In the embodiment of an electric apparatus 1 shown in FIG. 2, the foil 10 is arranged on an outer wall 21 of the housing 20. The foil 10 is therefore reshaped starting from its original shape shown in FIG. 1, so that the shape of the foil 10 corresponds to the shape of the outer wall 21 of the housing 20. In the adhesive-coated embodiment of the foil 10, the foil may be glued onto the outer wall 21 of the housing 20. If the foil 10 is provided with the plastic coating 12, the foil 10 may be sealed on the outer wall 21 of the housing 20. After reshaping the foil 10, the foil may be applied with its plastic-coated side to the outer wall 21. The foil 10 is then bonded to the outer wall 21 of the housing 20 by hot sealing. To do so, the foil 10 is heated, so that the plastic coating 12 melts and is bonded to the outer wall 21 of the housing 20.

In the embodiment of the electric apparatus 1 shown in FIG. 3, the foil 10 is arranged on an inner wall 22 of the housing 20. The inner wall 22 of the housing 20 is thus lined with the foil 10. The foil 10 may therefore have the adhesive coating 11 shown in FIG. 1, for example, on one side and may be adhered to the inner wall 22 of the housing 20 by way of the adhesive coating. According to another possible embodiment, the foil 10 may be sealed onto the inner wall 22 of the housing 20. The foil 10 may have the plastic coating 12, for example, and be bonded to the inner wall 22 of the housing 20 by hot sealing after being shaped. The foil 10 may therefore first be shaped, so that it already has the shape of the inner wall 22. Next, the foil 10 is inserted into the interior of the housing 10. The foil 10 can be bonded to the inner wall 22 of the housing 20 by subsequent heating and melting of the plastic coating 12.

In the embodiments of the electric apparatus 1 shown in FIGS. 2 and 3, the housing 30 made of the electrically and/or magnetically conductive material, on the one hand, and the housing 20, made of the electrically and/or magnetically non-conductive material, together with the foil 10 on the other hand, take over the shielding of the at least one electric device 40 from electric and/or magnetic radiation. The electrically and/or magnetically conductive housing 30 may be a metallic housing, for example. The at least one device 40 can therefore be protected inexpensively from electric and/or magnetic radiation.

Since the foil 10 can be designed to be very thin, for example, having a material thickness between 0.2 mm and 1 mm, the housing 20 covered with the foil 10 and/or the housing 20 lined with the foil 10 permits full protection from electric and/or magnetic radiation, with a reduction in weight at the same time, in comparison with the use of a metallic cover. Due to the fixation of the electrically and/or magnetically conductive foil 10 on a plastic material of the housing 20, the construction makes it possible to provide plastic housing parts with EMC protection properties. In addition, the housing 20 having the electric and/or magnetic shielding by the foil 10 has better shielding attenuation properties than would be possible by coating the housing 20 with conductive EMC paints or due to the use of EMC cloth or conductive nonwovens inserted into the housing 20.

The shielding is scalable through the choice of the foil material. For example, a housing having a purely electric shielding can be made available by using an electrically conductive material for the foil 10. To this end, the foil 10 may be embodied, for example, as aluminum foil. When using a foil of an electrically and magnetically conductive material, for example, when using a steel sheet foil, the housing 20 in combination with this foil may have both electric and magnetic shielding properties.

Figure 4:
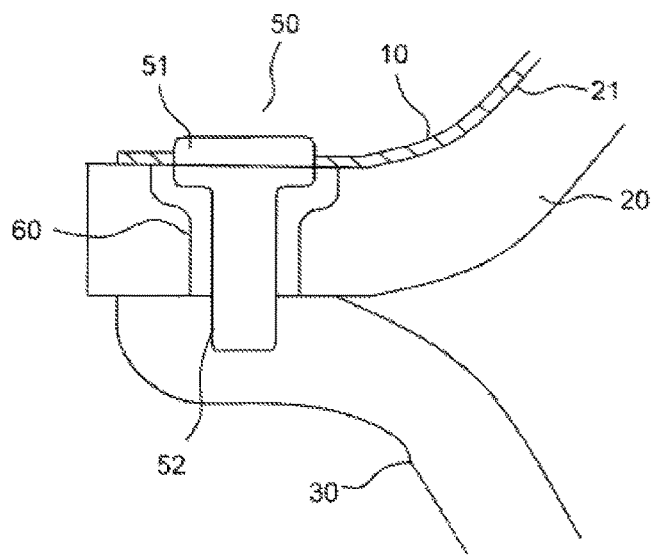
FIG. 4 is a partial cross section view of a connection of two housings for shielding an electric device from electric and/or magnetic radiation.

FIG. 4 shows another embodiment of the fastening of the foil 10 on the housing 20. According to the alternative shown in FIG. 4, the housing part 20 covered with the foil 10, for example, a glass fiber-reinforced plastic part is screw-connected to the electrically and/or magnetically conductive housing 30, for example, with a metallic housing. The edges of the housings 20 and 30 lying one on top of the other may therefore have holes to receive the screws 50, depending on the number of screws 50 to be provided. For example, bushings 60 may be provided in the holes. In the variant in which the foil 10 is arranged on an outer wall 21 of the housing 20, the foil is shaped, so that parts of the foil 10 come to lie above the holes for receiving the screws. When screwing the two housing parts 20 and 30, at the same time the foil 10 is affixed to the outer wall 21 of the housing 20. This fixation is accomplished, for example, by way of a respective screw head 51 on the screws 50. The diameter of the screw head 51 may be, for example, at least twice as large as the diameter of the thread 52 on the screws. When the screws are tightened, the foil 10 is pressed against the housing 20 by the screw heads 51 and thereby affixed to the housing 20.

Figure 5A:
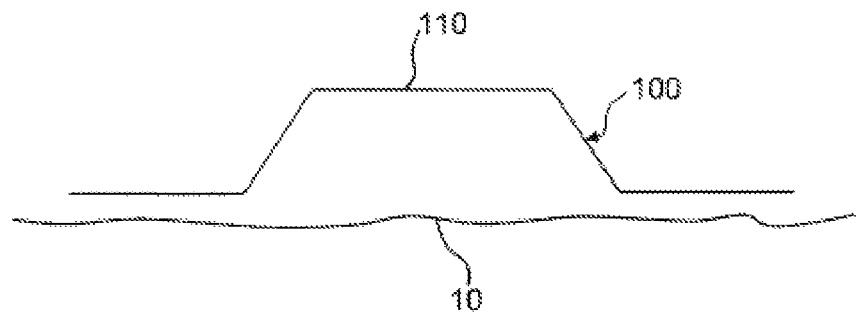
FIG. 5A illustrates a section through an embodiment of a method for production of a housing having shielding from electric and/or magnetic radiation.
Figure 5B:
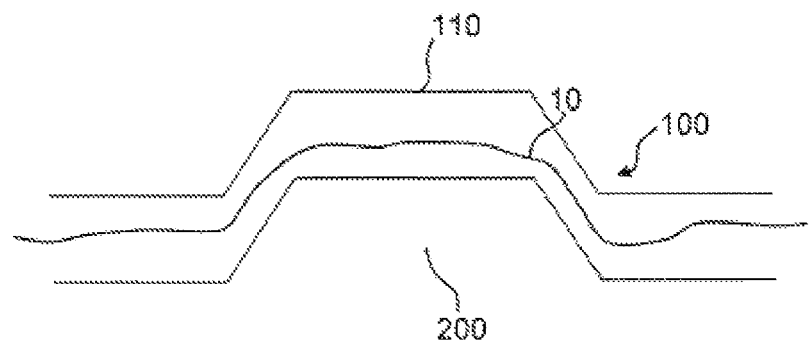
FIG. 5B illustrates another step of an embodiment of a method for production of a housing having shielding from electric and/or magnetic radiation.

FIGS. 5A and 5B show one possible embodiment of a method for shaping the foil 10 and/or for producing the housing 20 with a shielding from electric and/or magnetic radiation. Therefore, the foil 10, which is made of the electrically and/or magnetically conductive material and is shown in FIG. 1, is supplied as flat material sheeting. In addition, the housing 20, which is made of the electrically and/or magnetically nonconductive material, is provided with the outer wall 21 and/or the inner wall 22. The foil 10 is then shaped in such a way that the shape of the foil 10 corresponds to the shape of the outer wall 21 or the shape of the inner wall 22 of the housing 20. As shown in FIGS. 2 and 3, the foil 10 is next applied to the outer wall 21 of the housing 20 (FIG. 2) or to the inner wall 22 of the housing 20 (FIG. 3). The reshaped foil 10 may be applied to the housing 20 by adhesive bonding, hot sealing or screw connection.

For shaping the foil 10, a molding tool 100 having a wall 110, the shape of which corresponds to the outer wall 21 of the housing 20 or the shape of which corresponds to the inner wall 22 of the housing 20 is made available. As shown in FIG. 5A, the foil 10 is inserted into the mold tool 100. Next, the foil is reshaped in the mold tool 100 by pressing and/or applying force to the foil 10 against the wall 110 of the molding tool 100.

FIG. 5B shows this reshaping process. To do so, another molding tool 200, which has the inverse shape from that of the wall 110 of the molding tool 100, is made available. Foil 10 is pressed against the wall 110 of the molding tool 100 by pressing the additional molding tool 200, for example, a ram, against the wall 110 of the molding tool 100. The foil 10, which is arranged between the molding tool 100 and the additional molding tool 200, is thereby pressed against the wall 110 of the molding tool 100 and shaped according to the shape of the molding tool 100.

Figure 5C:
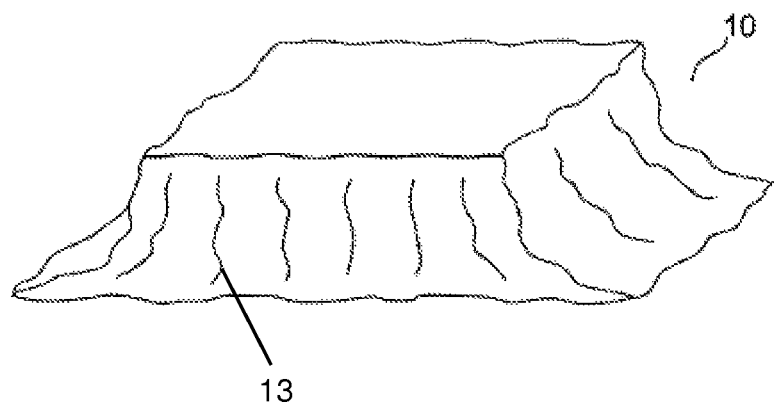
FIG. 5C illustrates an embodiment of a foil having shielding from electric and/or magnetic radiation.

FIG. 5C shows the foil 10, now reshaped in comparison with FIG. 1, after removal from the molding tool 100. When the foil 10 is pressed against the wall 110 of the molding tool 100 by way of the additional molding tool 200, the foil 10 is fed into the molding tool 100 at the side, so that, in pressing, enough foil material is available for the reshaping. The reshaped foil 10 shown in FIG. 5C therefore does not have any tears, but instead has only local folds 13. When using a suitable molding tool 200, the folds 13 can be smoothed out by pressing the foil 10 against the wall 110 of the molding tool 100, so that the reshaped foil 10 has an almost smooth surface after being removed and/or at least does not have any more protruding folds.

Figure 6A:
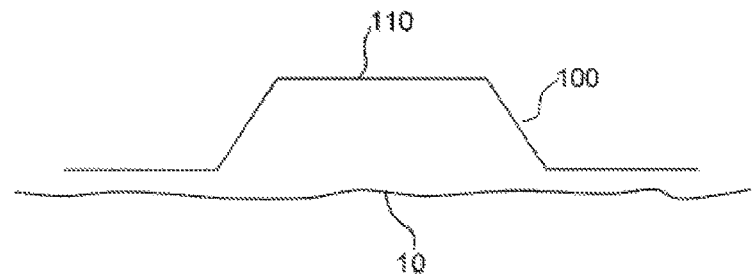
FIG. 6A illustrates a step in another embodiment of a method for production of a housing having shielding from electric and/or magnetic radiation.
Figure 6B:
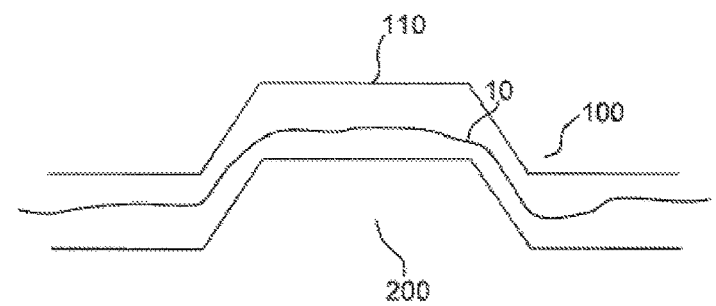
FIG. 6B illustrates another step in another embodiment of a method for production of a housing having shielding from electric and/or magnetic radiation.
Figure 6C:
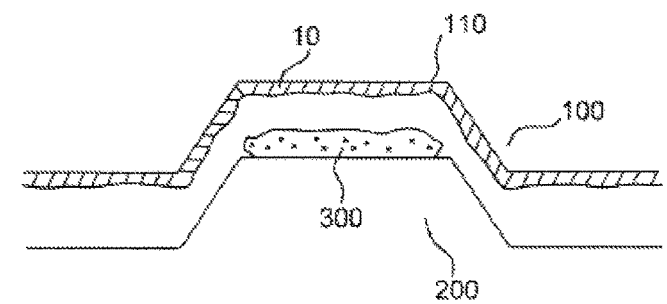
FIG. 6C illustrates another step in another embodiment of a method for production of a housing having shielding from electric and/or magnetic radiation.

FIGS. 6A, 6B and 6C show another possible embodiment of a method for shaping the foil 10 and/or for producing a housing having shielding from electric and/or magnetic radiation. Again in this method, an electrically and/or magnetically conductive foil 10 and a housing 20 made of an electrically and/or magnetically nonconductive material having an outer wall 21 and an inner wall 22 are made available. The foil 10 is now shaped by the method shown in FIGS. 6A, 6B and 6C, such that the shape of the foil 10 corresponds to the shape of the outer wall 21 of the housing 20 or of the inner wall 22 of the housing 20. After reshaping the foil 10, the reshaped foil is affixed to the outer wall 21 or the inner wall 22 of the housing 20. This fixation may take place by means of gluing, hot sealing or screw connection.

Again in the method illustrated in FIGS. 6A to 6C, a molding tool 100 having a wall 110, whose shape corresponds to that of the outer wall 21 of the housing 20 and/or whose shape corresponds to that of the inner wall 22, is made available. As shown in FIG. 6A, the foil 10 is inserted into the molding tool 100. Then, the foil 10 is reshaped in the molding tool 100 by pressing the foil 10 against the wall 110 of the molding tool 100. To do so, as shown in FIG. 6B, another molding tool 200, which has the inverse shape from that of the wall 110 of the molding tool 100, can be made available. The foil 10 is pressed by way of this additional molding tool 200 by pressing it against the wall 110 of the molding tool 100. The foil 10 is therefore arranged between the wall 110 of the molding tool 100 and the additional molding tool 200, for example, a ram of the molding tool 200. To prevent tears from developing, the foil 10 is fed into the molding tool 100 at the side during the pressing operation.

After pressing, the foil 10 is in form-fitting contact with the wall 110 of the molding tool 100. In a subsequent process step, which is shown in FIG. 6C, the material of which the housing 20 is shaped is then arranged on the foil 10 and/or connected directly to the foil 10. The foil 10 may therefore be back-injected with the electrically and/or magnetically nonconductive material of the housing 20, for example, a plastic material.

In the embodiment shown in FIG. 6C, the electrically and/or magnetically nonconductive material 300 of the housing 20, for example, a plastic composition, is applied to a surface of the additional molding tool 200. The additional molding tool 200 with the electrically and/or magnetically nonconductive material 300 is then pressed against the wall 110 of the molding tool 100 with the preformed foil 10. In pressing, the material composition of the housing 20 runs on the surface of foil 10 and is bonded directly to the foil 10 as a result of the pressing. No adhesive bonding, hot sealing or screw connection is necessary for affixing the foil 10 to the housing 20.

The foil 10 can be affixed to a surface as well as to an underside of the molding tools by the back-injection method as well as by the method (illustrated in FIG. 6C) of pressing with the help of needle holders or with the help of a vacuum which uses vacuum channels that may be provided in one of the molding tools 100 and/or 200. To prevent air inclusions from occurring in back-injection or pressing with the additional molding tool 200, the foil 10 may be perforated. If bushings or other connecting elements are inserted at the same time, the foil can be affixed to the material of the housing 20 in the molding tool by the bushings.

Figure 6D:
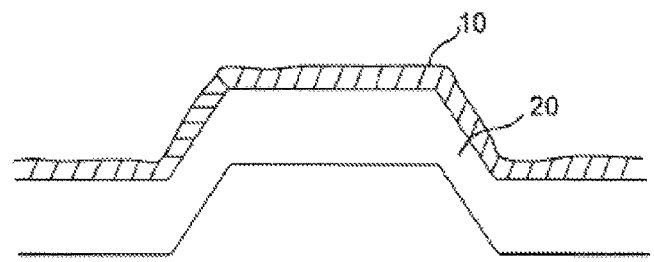
FIG. 6D illustrates one embodiment of a housing having shielding from electric and/or magnetic radiation.

FIG. 6D shows the housing 20 with the foil 10 pressed onto it after being removed from the molding tool 100. The housing 20 with the foil 10 affixed to it can then be attached to the housing 30 by screw connection to the housing 30, so that the electric device 40 is protected from electric and/or magnetic radiation.

LIST OF REFERENCE NUMERALS

1 Electric apparatus
10 Foil
11 Adhesive coating
12 Plastic coating
13 Pressed folds in the foil
20 Housing of electrically and/or magnetically nonconductive material
21 Outer wall of the housing
22 Inner wall of the housing
30 Housing of electrically and/or magnetically conductive material
40 Electric device/high-voltage storage device
50 Screw
60 Bushing
100 Molding tool
200 Molding tool The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for producing a housing having shielding from at least one of electric and magnetic radiation, the method comprising:
   providing a foil that is at least one of electrically and magnetically conductive;
   providing a housing of a material that is at least one of electrically and magnetically nonconductive, the housing having an inner wall and an outer wall;
   shaping the foil to a shape of substantially an entire surface of the outer or inner wall of the housing, the foil being a continuous foil without perforations or slots in a central region of the outer or inner wall;
   arranging the foil on the surface of the inner or outer wall of the housing such that the foil covers substantially the entire surface of the outer or inner wall of the housing for which the foil is shaped;
   wherein the shaping of the foil further comprises:
   providing a molding tool with a wall whose shape corresponds to that of the inner or outer wall of the housing;
   inserting the foil into the molding tool;
   reshaping the foil in the molding tool by pressing the foil against the wall of the molding tool;
   providing an additional molding tool which has an inverse shape from the wall of the molding tool; and
   pressing the foil against the wall of the molding tool by pressing the additional molding tool against the wall of the molding took wherein the foil is arranged between the molding tool and the additional molding tool.

2. The method according to claim 1, further comprising:
   feeding the foil into the molding tool while the foil is being pressed against the wall of the molding tool.

3. The method according to claim 2, further comprising:
   pressing the foil against the wall of the molding tool such that folds of the foil are pressed smoothly.

4. The method according to claim 1, further comprising:
   pressing the foil against the wall of the molding tool such that folds of the foil are pressed smoothly.

5. The method according to claim 1, further comprising:
   adhesive bonding of the shaped foil to the outer or inner wall of the housing.

6. The method according to claim 1, further comprising:
   screwing the shaped foil to the outer or inner wall of the housing.

7. The method according to claim 1, further comprising:
   heating the material of the housing;
   pressing the material of the housing onto the shaped foil, wherein the shaped foil is in contact with the wall of the molding tool during the pressing of the material of the housing onto the shaped foil; and
   bonding the material of the housing to the shaped foil after cooling the material of the housing.

8. The method according to claim 1, wherein:
   the foil is designed as an aluminum or sheet steel foil; and
   the housing contains a plastic material.

9. A method for producing a housing having shielding from at least one of electric and magnetic radiation, the method comprising:
   providing a foil that is at least one of electrically and magnetically conductive;
   providing a housing of a material that is at least one of electrically and magnetically nonconductive, the housing having an inner wall and an outer wall;

shaping the foil to a shape of substantially an entire surface of the outer or inner wall of the housing, the foil being a continuous foil without perforations or slots in a central region of the outer or inner wall;

arranging the foil on the surface of the inner or outer wall of the housing such that the foil covers substantially the entire surface of the outer or inner wall of the housing for which the foil is shaped;

sealing the shaped foil onto the outer or inner wall of the housing;

supplying the foil, before the shaping of the foil, with a plastic coating on one surface of the foil; and hot sealing the shaped foil onto the outer or inner wall of the housing by heating and melting the plastic coating and bonding the plastic coating to the outer or inner wall of the housing.

10. A method for producing a high-voltage storage device having shielding from at least one of electric and magnetic radiation, the method comprising:

producing the housing having shielding from the at least one of electric and magnetic radiation according to claim 1;

providing an additional housing of an additional housing material that is at least one of electrically and magnetically conductive, wherein a charge storage device of the high-voltage storage device is enclosed by the additional housing; and arranging the housing as a cover on the high-voltage storage device on the additional housing.

\* \* \* \* \*